(12) United States Patent
Akasegawa et al.

(10) Patent No.: US 8,952,846 B2
(45) Date of Patent: Feb. 10, 2015

(54) ELECTRONIC APPARATUS, METHOD OF MAKING THE SAME, AND TRANSCEIVING DEVICE

(75) Inventors: Akihiko Akasegawa, Kawasaki (JP); Satoshi Masuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 527 days.

(21) Appl. No.: 13/271,579

(22) Filed: Oct. 12, 2011

(65) Prior Publication Data
US 2012/0092218 A1  Apr. 19, 2012

(30) Foreign Application Priority Data

Oct. 15, 2010 (JP) .................................. 2010-232386

(51) Int. Cl.
*G01S 13/00* (2006.01)
*H01L 23/66* (2006.01)
(Continued)

(52) U.S. Cl.
CPC . *H01L 23/49822* (2013.01); *H01L 2924/30107* (2013.01); *H01L 2224/48175* (2013.01); *H01L 23/66* (2013.01); *H01L 2924/15192* (2013.01); *H01L 2223/6683* (2013.01); *H01L 24/48* (2013.01); *H01L 2924/1423* (2013.01); *H01L 2924/09701* (2013.01); *H01L 2924/19105* (2013.01); *H01L 2924/16172* (2013.01); *H01L 23/3677* (2013.01); *H01L 2924/19041* (2013.01); *H01L 2924/19107* (2013.01); *H01L 2924/16196* (2013.01); *H01L 2924/3011* (2013.01); *H01L 2924/01019* (2013.01); *H01L 2924/16152* (2013.01); *H01L 2924/15174* (2013.01)

USPC .............................................. 342/175; 342/70

(58) Field of Classification Search
CPC ............ G01S 7/03; G01S 7/032; G01S 13/34
USPC ..................................................... 342/70, 175
See application file for complete search history.

(56) References Cited

U.S. PATENT DOCUMENTS 4,729,061 A * 3/1988 Brown ........................... 361/719
4,967,201 A * 10/1990 Rich, III ....................... 342/175
(Continued)

FOREIGN PATENT DOCUMENTS

EP  CN1531071 A  9/2004
JP  7-193187 A  7/1995
(Continued)

OTHER PUBLICATIONS

Hans, Hommel et al., "Current Status of Airborne Active Phased Array (AESA) Radar Systems and Future Trends", IEEE MTT-S International Microwave Symposium digest 2005, vol. 3, pp. 1449-1452.
(Continued)

*Primary Examiner* — John B Sotomayor
*Assistant Examiner* — Marcus Windrich
(74) *Attorney, Agent, or Firm* — Kratz, Quintos & Hanson, LLP

(57) ABSTRACT

An electronic apparatus includes a metal base; a wiring board disposed on the metal base, the wiring board having an opening and including interconnects; a metal stage dispose in the opening, the metal stage serving as a ground line; and a semiconductor device disposed on the metal stage, wherein an area of an end surface of the metal stage facing the metal base is larger than that of the metal stage facing the semiconductor device.

17 Claims, 15 Drawing Sheets

(51) Int. Cl.
*H01L 23/367* (2006.01)
*H01L 23/498* (2006.01)
*H01L 23/00* (2006.01)

(56) References Cited

U.S. PATENT DOCUMENTS

| | | | |
|---|---|---|---|
| 5,457,605 A | | 10/1995 | Wagner et al. |
| 5,708,283 A | * | 1/1998 | Wen et al. ............ 257/276 |
| 6,114,986 A | * | 9/2000 | Cassen et al. ............ 342/175 |
| 2004/0178500 A1 | | 9/2004 | Usui ............ 257/734 |
| 2008/0303147 A1 | * | 12/2008 | Watanabe et al. ............ 257/737 |
| 2010/0164783 A1 | * | 7/2010 | Choudhury et al. ............ 342/175 |
| 2010/0167666 A1 | * | 7/2010 | Choudhury et al. ............ 455/90.2 |

FOREIGN PATENT DOCUMENTS

| | | |
|---|---|---|
| JP | 10-284507 A | 10/1998 |
| JP | 11-191603 A | 7/1999 |
| JP | 2007-329204 A | 12/2007 |
| WO | WO 96/26540 A1 | 8/1996 |

OTHER PUBLICATIONS

Office Action of Chinese Patent Application No. 201110319614.2 dated Jan. 6, 2014 with Full Translation.

Office Action dated Apr. 22, 2014 from the Japan Patent Office corresponding to Japan Patent Application No. 2010-232386 with English translation.

Office Action dated Sep. 15, 2014 corresponding to Chinese Office Action No. 201110319614.2 with English translation.

Office Action dated Nov. 18, 2014 from the Japan Patent Office corresponding to Japan Patent Application No. 2010-232386 with English translation.

* cited by examiner

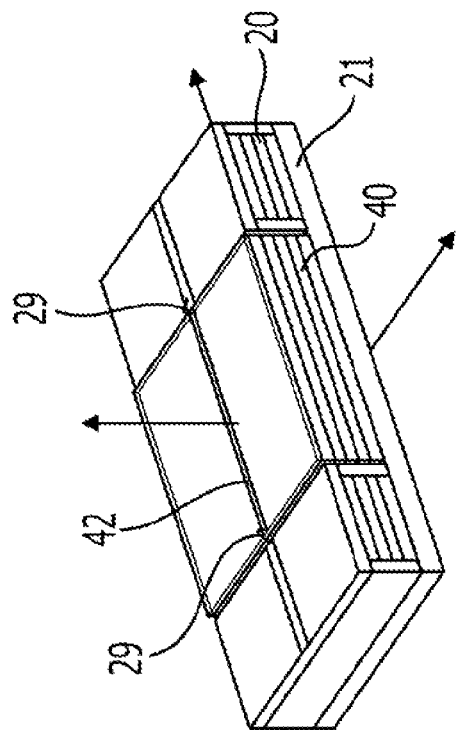
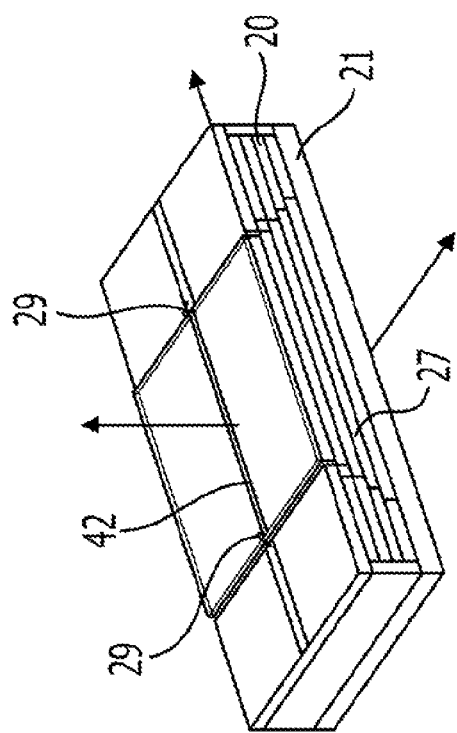

ELECTRONIC APPARATUS, METHOD OF MAKING THE SAME, AND TRANSCEIVING DEVICE

CROSS-REFERENCE TO RELATED APPLICATION

This application is based upon and claims the benefit of priority of the prior Japanese Patent Application No. 2010-232386 filed on Oct. 15, 2010, the entire contents of which are incorporated herein by reference.

FIELD

The present invention relates to an electronic apparatus, a method of making the same, and a transceiving device.

BACKGROUND

In recent years, a high-power, high-efficiency, and small radio-frequency device and a transceiving module including the same are used in the use of a radar, a satellite communication, or the like. Some of the devices and the transceiving modules manage hundreds of watts of power according to conditions.

In the current radar systems, it is important to construct a phased array system including hundreds to thousands of transceiving modules arranged in parallel for spatial control of radar beams.

It is therefore preferable to increase the performance of each transceiving module and reduce the size thereof. To realize such a transceiving module, there is a technique of forming components constituting the transceiving module as monolithic microwave integrated circuit (MMIC) chips and mounting the MMIC chips on a multilayer wiring board.

An example of related art is disclosed in H. Hommel et al., "Current Status of Airborne Active Phased Array (AESA) Radar Systems and Future Trends", IEEE MTT-S International Microwave Symposium digest 2005, vol. 3, pp. 1449-1452.

A radio-frequency device for, for example, a radar frequency band around 10 GHz and power levels of several watts and a transceiving module including the device have not faced any challenges. Recent trends toward higher power, higher efficiency, and reduction in size have highlighted the following challenge.

To realize a high-power, high-efficiency, and small radio-frequency device and a transceiving module including the device, a high-power amplifier (HPA) in MMIC chip form (hereinafter, referred to as an "HPA-MMIC chip") of a wide band gap semiconductor material, such as gallium nitride (GaN), may be used.

Such an HPA-MMIC chip considerably generates heat. To dissipate heat, therefore, an opening, indicated at 101, for a metal stage (hereinafter, "metal stage opening") may be provided in a multilayer wiring board 100, a metal stage (heat spreader) 102 may be disposed in the metal stage opening 101, and an HPA-MMIC chip 103 may be disposed on the metal stage 102, as illustrated in FIG. 14.

Unfortunately, it is difficult to prevent an increase in temperature of the HPA-MMIC chip 103 because the thermal resistance of the metal stage 102 is high.

Particularly in a case where an HPA-MMIC chip is mounted on a high thermal conductivity substrate, such as a silicon carbide (SiC) substrate in consideration of crystal structure and heat dissipation, a heat dissipation path tends to spread in the in-plane direction (lateral direction). Accordingly, the thickness of the metal stage contributes to an increase in thermal resistance. Disadvantageously, the metal stage is inadequate to serve as a heat spreader.

Although the challenge related to the case where the HPA is used to construct the radio-frequency device and the transceiving module including the device has been described above, the challenge is not limited to this case. A case where a semiconductor device which generates heat is used to construct an electronic apparatus has to address a similar challenge.

SUMMARY

According to an aspect of an embodiment, an electronic apparatus includes: a metal base; a wiring board disposed on the metal base, the wiring board including an opening and interconnects; a metal stage dispose in the opening, the metal stage serving as a ground line; and a semiconductor device disposed on the metal stage, wherein an area of an end surface of the metal stage facing the metal base is larger than that of the metal stage facing the semiconductor device.

The object and advantages of the invention will be realized and attained at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 9A is a schematic perspective view of a simplified model for verification of an effect of the transmission characteristics of the transceiving device according to the first embodiment.

FIG. 9B is a schematic perspective view of a simplified model according to a comparative example of the first embodiment.

DESCRIPTION OF EMBODIMENTS

Electronic apparatuses, methods of making the same, and transceiving devices according to embodiments of the present invention will be described below with reference to the drawings.

An electronic apparatus, a method of making the same, and a transceiving device according to a first embodiment will now be described with reference to FIGS. 1 through 10B.

The transceiving device according to the present embodiment is a transceiving module used for, for example, radar or various communications.

Figure 3:
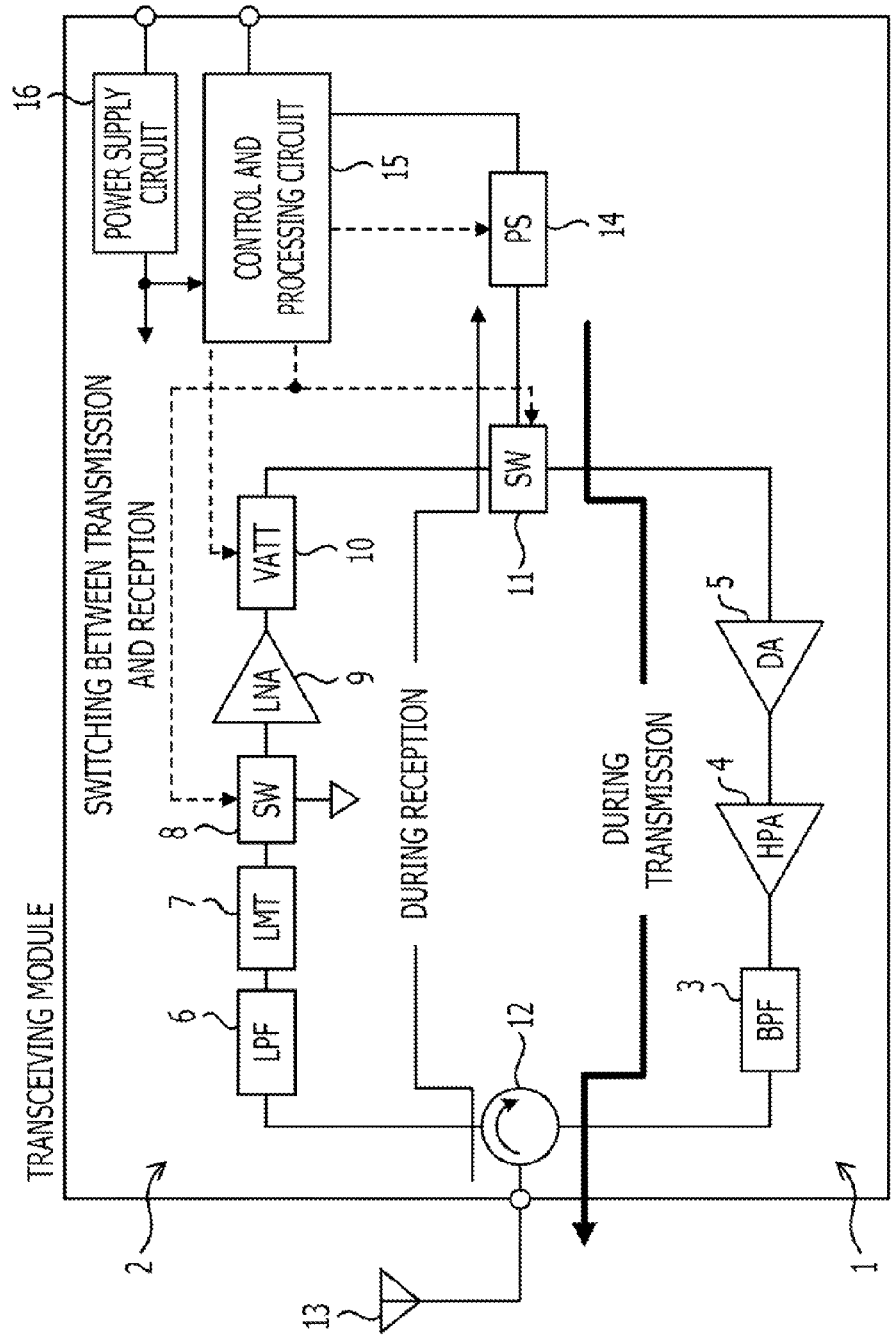
FIG. 3 is a schematic block diagram of the circuitry of the transceiving device according to the first embodiment.

Referring to FIG. 3, this transceiving device includes a transmitting unit 1 (lower part of FIG. 3) which includes components for a transmitting system to transmit a signal and a receiving unit 2 (upper part of FIG. 3) which includes components for a receiving system to receive a reflected signal of the transmitted signal.

The transmitting system components include a filter (band-pass filter: BPF) 3, a high-power amplifier (HPA) 4, and a driver amplifier (DA) 5.

The band-pass filter 3 is configured to reject unnecessary or undesired frequencies, such as high frequencies.

The high-power amplifier 4 is configured to amplify the power of a radio frequency signal (transmission wave) to be transmitted up to predetermined transmission power with high efficiency in order to transmit a radio frequency signal with high output power.

The driver amplifier 5 is configured to output a radio frequency signal with input power for a desired output of the high-power amplifier 4.

The receiving system components include a filter (low-pass filter: LPF) 6, a limiter (LMT) 7, a switch (SW) 8, a low noise amplifier (LNA) 9, and a variable attenuator (VATT) 10.

The low-pass filter 6 is configured to reject unnecessary or undesired frequencies.

The limiter 7 is configured to limit a received radio frequency signal (received wave) to a predetermined power level and output the resultant signal to the next stage. This limiter 7 functions as a protecting circuit for the low noise amplifier 9 when a radio frequency signal with high-power is received.

The switch 8 is configured to ensure high isolation. The switch 8 may be switched on or off at predetermined transmission/reception timing. The switch 8 functions as a protecting circuit for the low noise amplifier 9.

The low noise amplifier 9 is configured to amplify a received wave with low noise.

The variable attenuator 10 is configured to regulate the amplitude of a received wave.

In the transceiving device, a switch 11 connected to ends of the above-described systems switches between transmission and reception at predetermined transmission reception timing.

A circulator 12 connected to the other ends of the systems transmits a transmission wave from the transmitting unit 1 to an antenna 13 and transmits a received wave from the antenna 13 to the receiving unit 2 to ensure isolation between transmission and reception.

The transceiving device is provided with the antenna 13, shared between transmission and reception, disposed on one side. Spatial signal transmission and reception is performed through the antenna 13. The antenna 13 shared between transmission and reception is connected to the transmitting unit 1 and the receiving unit 2 through the circulator 12.

The transceiving device is further provided with a phase shifter 14 and a control and processing circuit 15, including a field-programmable gate array (FPGA) and an analog-to-digital/digital-to-analog converter (AD/DAC), disposed on the other side to allow the phase shifter 14 and the control and processing circuit 15 to perform advanced digital signal processing. The phase shifter 14 and the control and processing circuit 15 are connected through the switch 11 to the transmitting unit 1 and the receiving unit 2.

The phase shifter 14 is configured to shift the phase of a radio frequency signal for beam scanning under the control of either of the transmitting and receiving systems.

The control and processing circuit 15 is configured to control the switches 8 and 11, the variable attenuator 10, and the phase shifter 14 and perform conversion between analog and digital signals.

The transceiving device is further provided with a power supply circuit (power supply and bias circuit) 16 on the other side such that the power supply circuit 16 is connected to components which require power supply. For example, to effect the operations of the high-power amplifier 4, the driver amplifier 5, and the low noise amplifier 9 which function as active elements, the power supply circuit 16 is connected to these components.

Figure 4:
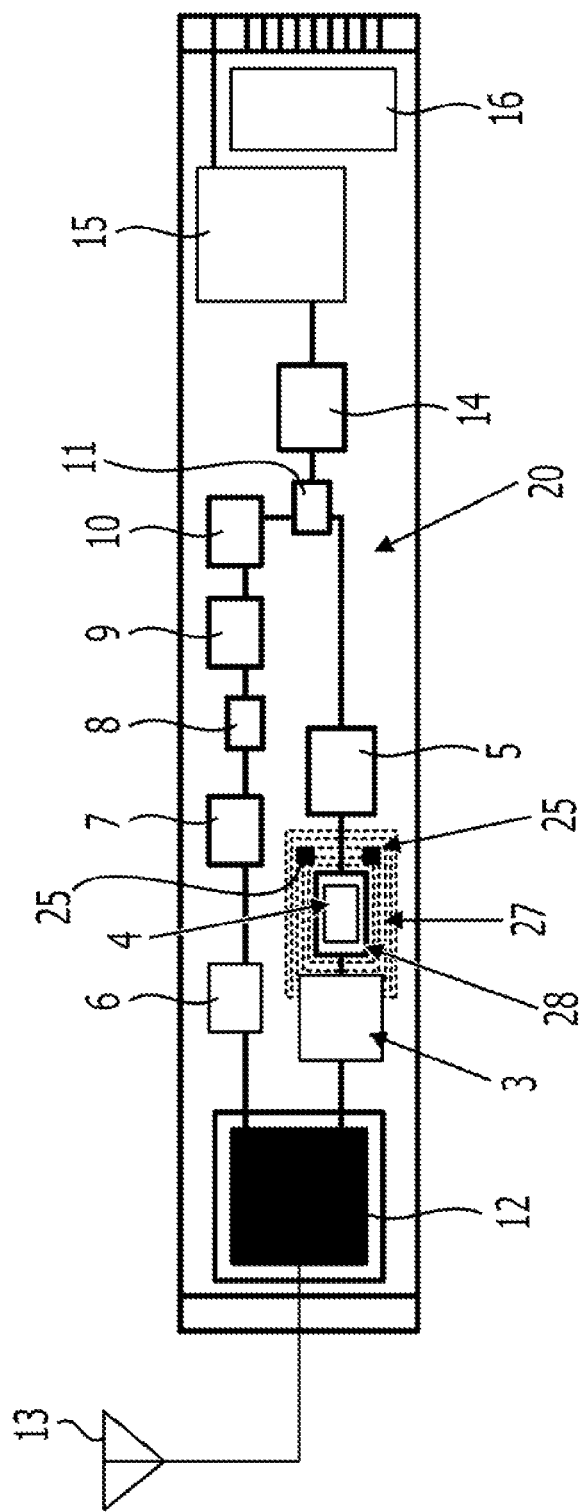
FIG. 4 is a schematic diagram illustrating the entire structure of the transceiving device according to the first embodiment.
Figure 5B:
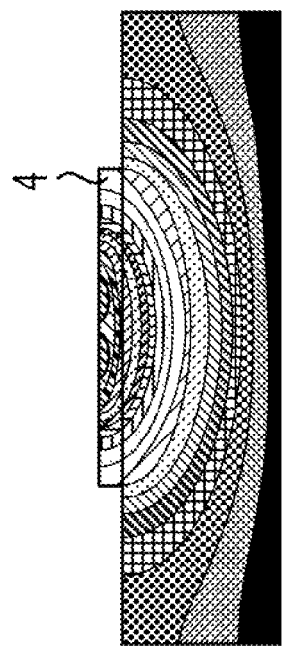
FIG. 5B is a diagram illustrating a heat dissipation state of an HPA-MMIC chip on a SiC substrate.
Figure 5A:
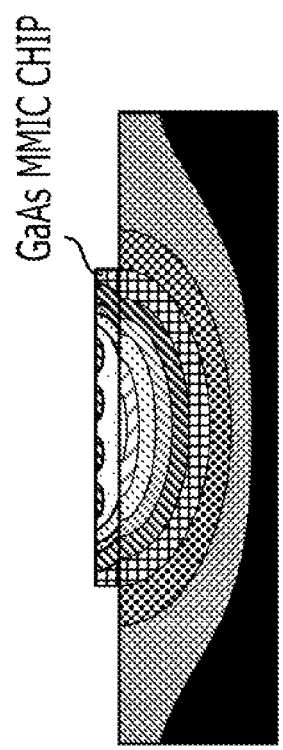
FIG. 5A is a diagram illustrating a heat dissipation state of an HPA-MMIC chip on a gallium arsenide (GaAs) substrate.

The transceiving device has the above-described circuitry. As illustrated in FIG. 4, the components 3 to 12 and 14 to 16 are mounted on a multilayer wiring board 20 to form an electronic apparatus.

Figure 1:
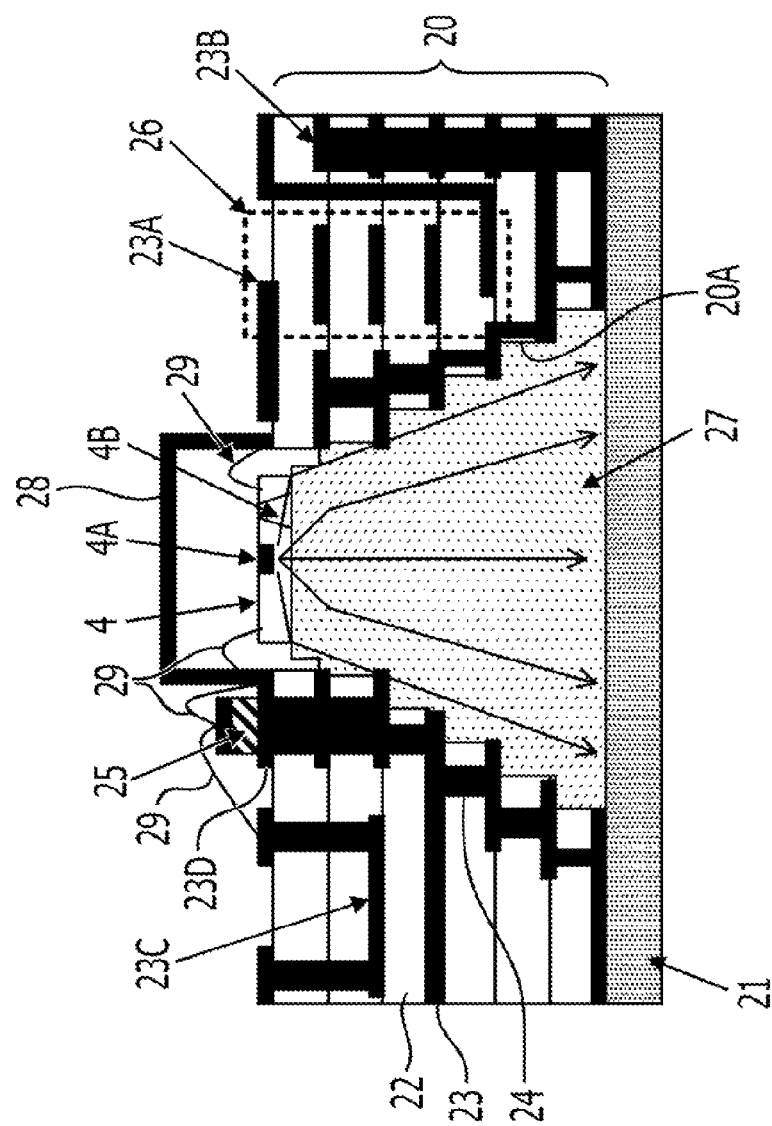
FIG. 1 is a schematic cross-sectional view of a transceiving device according to a first embodiment of the present invention.

Specifically, the electronic apparatus according to the present embodiment includes a metal base 21, the multilayer wiring board 20 disposed on the metal base 21, and the components 3 to 12 and 14 to 16 mounted on the multilayer wiring board 20 as illustrated in FIG. 1. Because the electronic apparatus is configured to transmit a radio frequency signal, the electronic apparatus will also be termed a radio-frequency device.

The metal base 21 is made of a metal material, such as Kovar, copper (Cu), or aluminum (Al).

The multilayer wiring board 20 is a wiring board including interconnects. The multilayer wiring board 20 is a laminate of a plurality of base substrates 22, each provided with an interconnect 23 thereon such that the interconnects 23 arranged vertically are connected through vias 24 made of the same material. The multilayer wiring board 20 includes, as the interconnects 23, a radio frequency signal interconnect 23A for transmission of a radio frequency signal, a radio frequency ground interconnect 23B as a ground line, and a power supply/control interconnect 23C for supply and control of electric power to MMIC chips. In this case, the multilayer wiring board 20 includes, as surface layers, the radio frequency signal interconnect 23A and a power supply ground interconnect 23D for mounting chip capacitors 25. The multilayer wiring board 20 has functions built therein and includes, for example, a three-layer band-pass filter 26 having a stacked structure. The multilayer wiring board 20 has functions of, for example, the filter and a power distributing and combining circuit as described above, and its thickness is greater than or equal to about 1 mm (for example, about 2 mm). In the use of the multilayer wiring board 20 having such a thickness of about 1 mm or more, the thermal resistance ($R_{th}$=W·t/S where W denotes the amount of heat generated, S denotes the area, and t denotes the thickness) is high. Accordingly, the use of a metal stage 27 having the following structure is especially effective in this case.

Specifically, the multilayer wiring board 20 is a ceramic multilayer wiring board including laminated ceramic base substrates 22 each having the interconnect 23 thereon. For example, the multilayer wiring board 20 is an alumina multilayer wiring board (having a thickness of, for example, about 1.5 mm) including six laminated alumina base substrates 22 (each having a thickness of, for example, about 250 μm) each having the interconnect 23 thereon.

Regarding the components 3 to 12 and 14 to 16, for example, the low noise amplifier 9, the driver amplifier 5, and the high-power amplifier 4 are designed in MMIC chip form and are mounted on the multilayer wiring board 20. In this case, the low noise amplifier 9 and the driver amplifier 5 are mounted on the surface of the multilayer wiring board 20. In the present embodiment, the chip capacitors 25 are also mounted on the surface of the multilayer wiring board 20. The chip capacitors 25, which are metal-insulator-metal (MIM) chip capacitors, are connected through wires (or ribbons) 29 to the power supply/control interconnect 23C and connection lands of a metal cavity 28.

Particularly, to realize a high-power, high-efficiency, and small radio-frequency device and a transceiving module including the device, the high-power amplifier 4 in the present embodiment includes an HPA-MMIC chip in MMIC chip form of a wide band gap semiconductor material, such as GaN. The high-power amplifier 4 will also be termed a semiconductor device or semiconductor MMIC chip.

Specifically, the HPA-MMIC chip 4 is an HPA-MMIC chip, formed on a SiC substrate having a thickness of, for example, about 100 μm, including a GaN high electron mobility transistor (GaN-HEMT). In the HPA-MMIC chip 4, the GaN-HEMT serves as a heat generating portion 4A. The HPA-MMIC chip 4 has a ground via 4B therein.

The HPA-MMIC chip 4 considerably generates heat. In order to dissipate heat, a metal stage opening 20A is provided for the multilayer wiring board 20, the metal stage 27 is disposed in the metal stage opening 20A, and the HPA-MMIC chip 4 is disposed on the metal stage 27. In other words, the HPA-MMIC chip 4 is mounted on the metal stage 27 disposed in the metal stage opening 20A of the multilayer wiring board 20. The metal stage 27 will be also termed a semiconductor device stage or metal seat.

The metal stage 27 is made of a metal material, such as Cu or copper tungsten (CuW), having a relatively high thermal conductivity, and functions as a heat spreader.

The metal stage opening 20A is shaped such that the dimensions thereof adjacent to the metal base 21 are larger than those adjacent to the HPA-MMIC chip 4. The metal stage 27 is shaped such that the end face thereof facing the metal base 21 is larger than that facing the HPA-MMIC chip 4.

Figure 2:
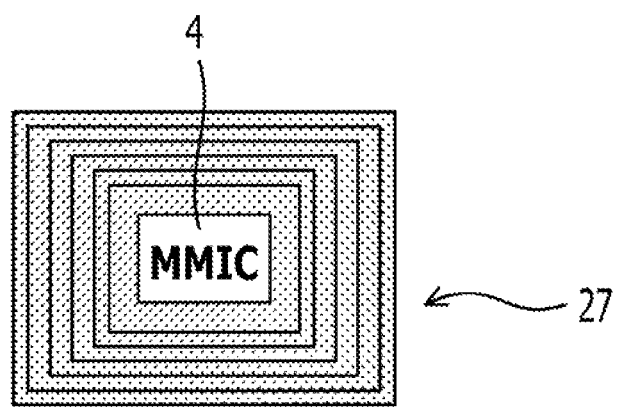
FIG. 2 is a schematic plan view of a metal stage included in the transceiving device according to the first embodiment.

Specifically, the metal stage 27 in the present embodiment is shaped such that the area of the horizontal cross-section increases as the horizontal cross-section approaches the metal base 21. In other words, the metal stage 27 has a vertical cross-section that becomes wider toward the bottom and has stepped wall surfaces (side surfaces) as illustrated in FIGS. 1 and 2. The multilayer wiring board 20 has the metal stage opening 20A having a shape corresponding to the shape of the metal stage 27. In other words, the multilayer wiring board 20 has stepped wall surfaces defining the metal stage opening 20A. The metal stage 27 is fitted in the metal stage opening 20A of the multilayer wiring board 20.

Because the metal stage 27, serving as the heat spreader, has a shape that becomes wider toward the bottom as described above, the thermal resistance of the metal stage 27 may be reduced, so that the temperature of the HPA-MMIC chip 4 may be prevented from increasing.

Particularly, when the HPA-MMIC chip 4 formed on the SiC substrate (refer to FIG. 5B) is compared with an HPA-MMIC chip formed on a GaAs substrate (refer to FIG. 5A), a heat path (heat dissipation path) tends to spread in the in-plane direction, thus increasing the thermal resistance. Accordingly, the metal stage 27 having the above-described structure is especially effective in using the HPA-MMIC chip 4 formed on a high thermal conductivity substrate, such as a SiC substrate. In each of FIGS. 5A and 5B, the MMIC chip is disposed on an aluminum seat having a thickness of about 1 mm.

In this electronic apparatus, as illustrated in FIG. 1, the metal cavity 28 is provided in order to prevent interference with electromagnetic fields in the environment and ensure sealing. In the present invention, the metal cavity 28 is provided such that the metal cavity covers the MMIC chip (the HPA-MMIC chip 4 in FIG. 1) to prevent the interference between electromagnetic fields of the components or parasitic resonance in order to provide high frequency transmission and reception. In this case, a small metal cavity measuring, for example, several millimeters square is provided as the metal cavity 28. The metal cavity 28 is connected through the connection lands thereof to the MMIC chip (the HPA-MMIC chip 4 in FIG. 1) by the wires (or ribbons) 29.

In the case where the small metal cavity is provided, the metal stage is generally small. Because the area of heat dissipation is small, the thermal resistance is not reduced equivalently. Accordingly, devising the shape of the metal stage 27 as described above is especially effective in increasing the heat dissipation performance of the metal stage.

With the provision of high frequency transmission and reception, impedance mismatch may be easily caused by the gap between the metal stage 27 and the multilayer wiring board 20, thus resulting in a reduction in high-frequency characteristics or an unstable state of ground of a power supply system (bias system). In addition, if many vias are formed to provide the ground line, the strength of the apparatus is reduced.

In this electronic apparatus, the wall surfaces of the metal stage 27 are electrically connected to the interconnect 23 (the radio frequency ground interconnect 23B) of the multilayer wiring board 20 by, for example, brazing or low-temperature bonding. Accordingly, the metal stage 27 serves as a ground line for a radio frequency signal system.

In addition, the wall surfaces of the metal stage 27 are electrically connected to the interconnect 23 (the power supply ground interconnect 23D) of the multilayer wiring board 20 by, for example, brazing or low-temperature bonding. Furthermore, the ground via 4B in the HPA-MMIC chip 4 is electrically connected to the metal stage 27 by, for example, soldering. Accordingly, the metal stage 27 serves as a ground line for the power supply system.

In this case, the metal stage 27 is in contact with the multilayer wiring board 20. Specifically, the wall surfaces of the metal stage 27 are in contact with the interconnects 23 (the radio frequency ground interconnect 23B and the power supply ground interconnect 23D) of the multilayer wiring board 20. Although the wall surfaces of the metal stage 27 are in contact with the radio frequency ground interconnect 23B and the power supply ground interconnect 23D in this case, the wall surfaces of the metal stage 27, which are not in contact with the radio frequency ground interconnect 23B and the power supply ground interconnect 23D because of a manufacturing error or the like, may be electrically connected thereto.

As described above, the metal stage 27, on which the HPA-MMIC chip 4 including the heat generating portion 4A is mounted, functions as a heat spreader and also functions as an RF/power supply ground line.

Consequently, the discontinuity between the metal stage 27 and the radio frequency ground interconnect 23B may be reduced, thus increasing high-frequency characteristics (transmission characteristics). Moreover, the discontinuity between the metal stage 27 and the power supply ground interconnect 23D may be reduced, thus stabilizing the power supply ground. In addition, because the metal stage 27 functions as the RF/power supply ground line, the number of vias may be reduced, thus increasing the strength. The use of the above-described structure may realize an electronic apparatus and transceiving module which exhibit good electrical and thermal characteristics and good strength and achieve high-frequency, high-power, and high-efficiency transmission and reception and a reduction in size.

A method of making the electronic apparatus (transceiving device) according to the present embodiment will now be described with reference to FIGS. 6A to 6K.

Figure 6A:
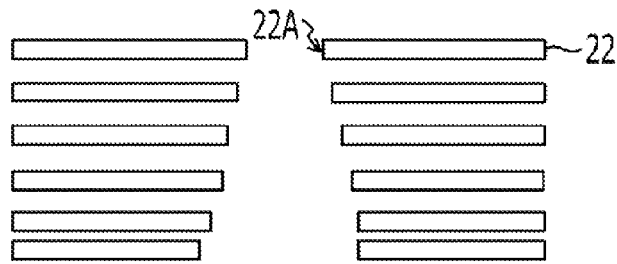
FIGS. 6A to 6K are schematic cross-sectional views explaining a method of making the transceiving device according to the first embodiment.

First, as illustrated in FIG. 6A, a plurality of alumina base substrates (ceramic base substrates, or green sheets) 22 making up the alumina multilayer wiring board (ceramic multilayer wiring board) 20 are formed such that the alumina base substrates 22 have different-sized openings 22A. Specifically, six alumina base substrates 22 having a thickness of, for example, about 250 µm are formed.

Figure 6B:
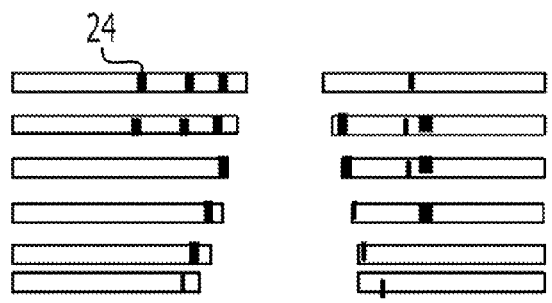

Subsequently, as illustrated in FIG. 6B, via holes are formed in the alumina base substrates 22 and are filled with a conductor, thus forming the vias 24. For example, when each alumina base substrate 22 is a high temperature co-fired ceramic (HTCC) base substrate, tungsten is used as a conductor. When each alumina base substrate 22 is a low temperature co-fired ceramic (LTCC) base substrate, silver is used as a conductor.

Figure 6C:
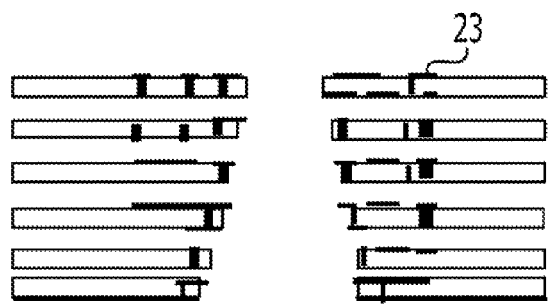

Then, as illustrated in FIG. 6C, a pattern of substantially the same conductor as that filled the via holes is printed on the surface of each alumina base substrate 22. Consequently, the interconnect 23 is formed on the surface of each alumina base substrate 22.

Figure 6D:
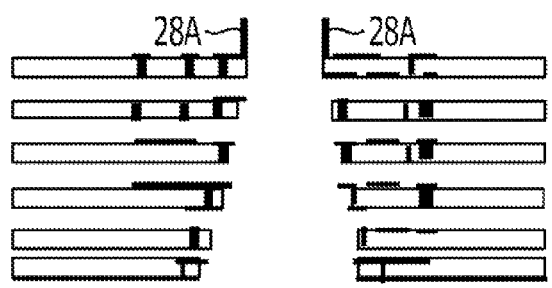

Subsequently, as illustrated in FIG. 6D, walls 28A of the metal cavity 28 are formed on the surface of the alumina base substrate 22, serving as the uppermost layer of the alumina multilayer wiring board 20.

Figure 6E:
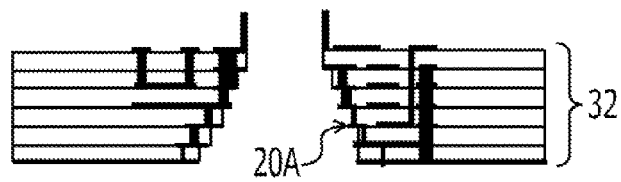

Next, as illustrated in FIG. 6E, the alumina base substrates 22 are laminated to form a laminate 32. At this time, the alumina base substrates 22 having the different-sized openings 22A are laminated such that the openings 22A are aligned, thus forming the laminate 32 having the metal stage opening 20A into which the metal stage 27 may be fitted. In this embodiment, the alumina base substrates 22 are sequentially laminated in the order from the substrate having the largest opening 22A to form the laminate 32, composed of the alumina base substrates 22, such that the metal stage opening 20A has stepped wall surfaces.

After that, the laminate 32 is fired.

Figure 6F:
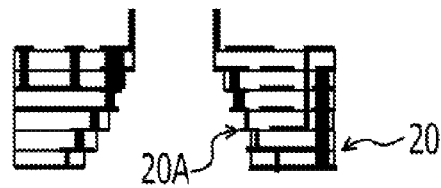

After the laminate 32 is subjected to plating, the resultant laminate is subjected to scribing as illustrated in FIG. 6F, thus forming the alumina multilayer wiring board 20 having the metal stage opening 20A. At this time, the formed alumina multilayer wiring board 20 includes part of the metal cavity 28. In this embodiment, the alumina multilayer wiring board 20 (having a thickness of, for example, about 1.5 mm) is formed which has the metal stage opening 20A having the stepped wall surfaces and includes the six alumina base substrates 22 laminated. Because each alumina base substrate 22 is provided with the interconnect 23 thereon, the alumina multilayer wiring board 20, serving as the laminate of the substrates, has such a structure that the interconnect 23 is disposed between the alumina base substrates 22 and the interconnects 23 arranged vertically are connected through the vias 24. The interconnects 23 include the radio frequency signal interconnect 23A, the radio frequency ground interconnect 23B, and the power supply/control interconnect 23C such that the alumina multilayer wiring board 20 has a built-in function, such as a band-pass filter (refer to FIG. 1) therein. When the alumina multilayer wiring board 20 has a built-in function of, for example, a filter or a power distributing and combining circuit, the board has a thickness of about 1 mm or more.

Figure 6G:
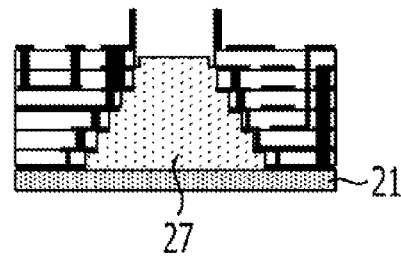

Subsequently, as illustrated in FIG. 6G, the alumina multilayer wiring board 20 formed in the above-described manner and the metal stage 27 having the stepped side walls are arranged on the metal base 21. In this case, while the metal stage 27 is fitted in the metal stage opening 20A of the alumina multilayer wiring board 20, the alumina multilayer wiring board 20 and the metal stage 27 are arranged on the metal base 21.

Next, the alumina multilayer wiring board 20, the metal stage 27, and the metal base 21 are joined. For example, when the alumina multilayer wiring board 20 includes HTCC substrates, brazing is used to join the alumina multilayer wiring board 20, the metal stage 27, and the metal base 21. When the alumina multilayer wiring board 20 includes LTCC substrates, low-temperature bonding with a preform material, such as gold-tin (AuSn), is used to join the alumina multilayer wiring board 20, the metal stage 27, and the metal base 21 at low temperature.

In this manner, joining is performed while the metal stage 27 is fitted in the metal stage opening 20A of the alumina multilayer wiring board 20.

Figure 6H:
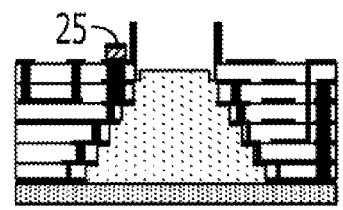

Subsequently, as illustrated in FIG. 6H, the chip capacitors 25, the MMIC chips (not illustrated), and the like are surface-mounted on the alumina multilayer wiring board 20.

Figure 6I:
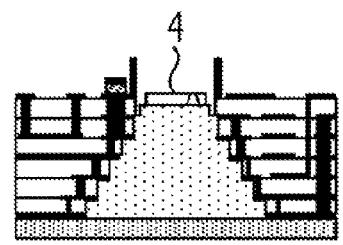

Then, as illustrated in FIG. 6I, the HPA-MMIC chip 4 is mounted on the metal stage 27. At this time, the HPA-MMIC chip 4, formed on the SiC substrate having a thickness of, for example, about 100 µm, including the GaN-HEMT is mounted on the metal stage 27 by soldering with, for example, AuSn. The HPA-MMIC chip 4 has the ground via 4B therein.

Figure 6J:
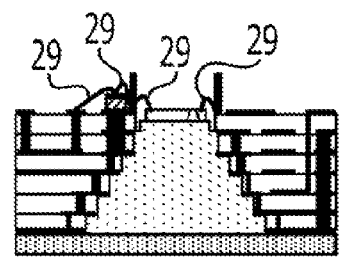

After that, as illustrated in FIG. 6J, the connection lands of the metal cavity 28 are connected to the MMIC chip (the HPA-MMIC chip 4 in FIG. 6J) by wires (or ribbons) 29. The connection lands of the metal cavity 28 are connected to the chip capacitors 25 by wires (or ribbons) 29. In addition, the chip capacitors 25 are connected to the power supply/control interconnect 23C by wires (or ribbons) 29.

Figure 6K:
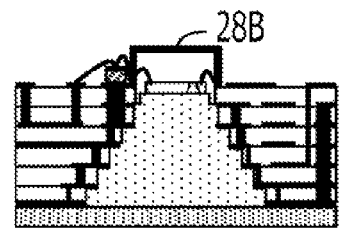

Finally, as illustrated in FIG. 6K, a lid 28B of the metal cavity 28 is attached and the seam is sealed, thus forming the metal cavity that covers the MMIC chip. In this case, the formed metal cavity 28 is a small metal cavity measuring, for example, several millimeters square.

In this manner, the transceiving device (electronic apparatus) is made.

The electronic apparatus, the method of making the same, and the transceiving device according to the present embodiment have advantages in that the thermal resistance of the metal stage 27 is reduced, the heat dissipation performance is improved, and the temperature of the semiconductor device 4 is prevented from increasing.

Verifications of effects of the metal stage 27 with the above-described structure using simplified models yielded the following results.

Figure 7A:
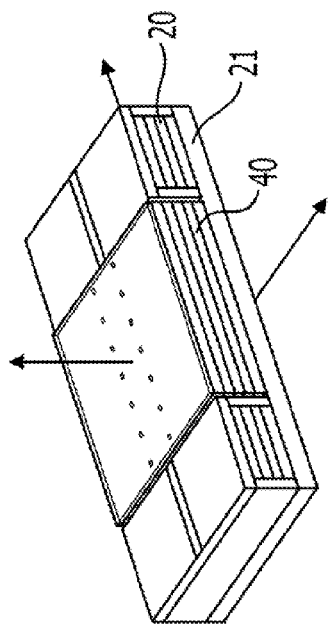
FIG. 7A is a perspective view of a simplified model for verification of a thermal effect of the transceiving device according to the first embodiment.
Figure 7B:
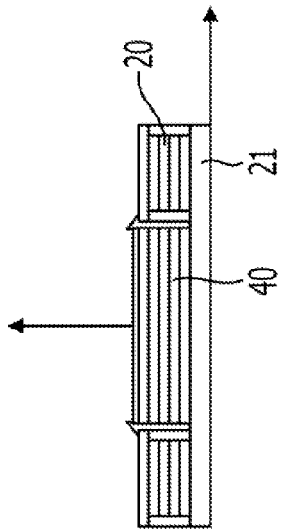
FIG. 7B is a cross-sectional view of the simplified model of FIG. 7A.
Figure 7C:
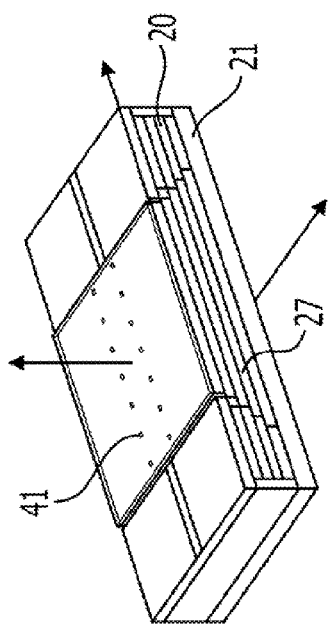
FIG. 7C is a perspective view of a simplified model according to a comparative example of the first embodiment.
Figure 7D:
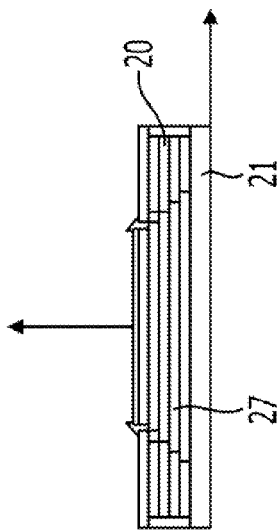
FIG. 7D is a cross-sectional view of the simplified model of FIG. 7C.

A simplified model was prepared which included a metal stage 27 having a shape that becomes wider in a radio frequency signal transmission direction and having stepped wall surfaces as illustrated in FIGS. 7A and 7B. As a comparative example, a simplified model was prepared which included a rectangular-parallelepiped metal stage 40 as illustrated in FIGS. 7C and 7D. These simplified models each included the alumina multilayer wiring board 20 including five alumina base substrates 22, each having a thickness of about 250 μm and including the interconnect 23 of tungsten and the vias 24 of tungsten. The simplified models each included the metal stage 27 of Cu and the metal base 21 of Kovar having dimensions of 5 mm×10 mm. In the structure illustrated in FIGS. 7A and 7B, the wall surfaces of the metal stage 27 were electrically connected to the radio frequency ground interconnect 23B. On the other hand, in the structure illustrated in FIGS. 7C and 7D, the gap between the alumina multilayer wiring board 20 and the metal stage 40 was set to about 100 μm.

Thermal simulation was performed using these simplified models to verify the thermal effect. As illustrated in FIGS. 7A and 7C, fourteen heat sources 41, each having dimensions of about 0.1 mm×about 0.05 mm and an amount of heat generated of about 3 W (600 W/mm$^2$), were arranged on each of the metal stages 27 and 40. The temperature of the rear surface (bottom surface) of each metal base 21 (base plate) was fixed at about 50° C.

Figure 8A:
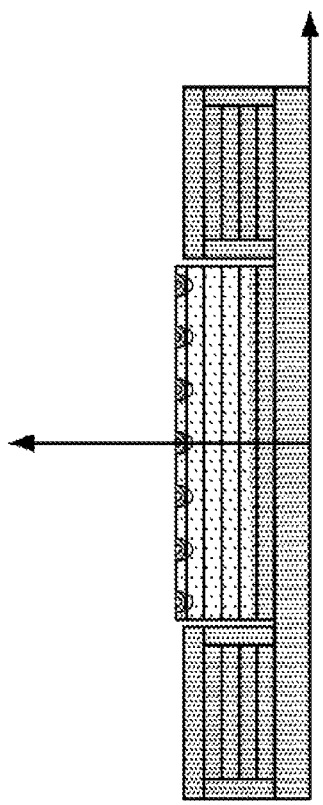
FIG. 8A is a diagram illustrating the result of thermal simulation using the simplified model for verification of the thermal effect of the transceiving device according to the first embodiment.
Figure 8B:
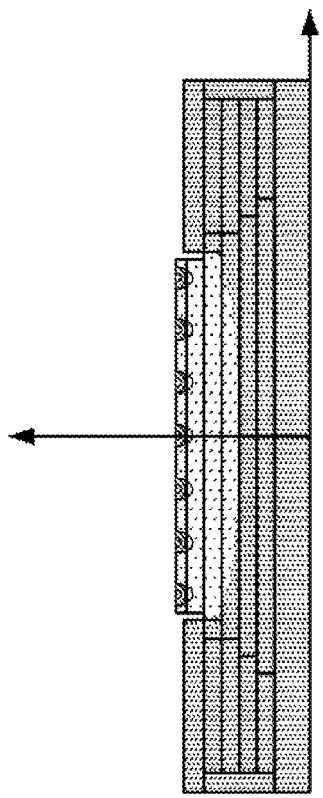
FIG. 8B is a diagram illustrating the result of thermal simulation using the simplified model according to the comparative example of the first embodiment.

As a result, as compared with the structure of FIGS. 7C and 7D, the highest temperature decreased by about 2° C. in the structure of FIGS. 7A and 7B. In the structure of FIGS. 7C and 7D, the temperature increased in a wide region along the thickness of the metal stage 40 as illustrated in FIG. 8B. On the other hand, in the structure of FIGS. 7A and 7B, the increase of temperature along the thickness of the metal stage was reduced as illustrated in FIG. 8A. As described above, it was found that the use of the metal stage having a structure illustrated in FIG. 8A reduced the thermal resistance of the metal stage and increased the heat dissipation performance thereof. In FIGS. 8A and 8B, the pattern of light and dark represents temperature levels. Dark portions represent low temperatures and light portions represent high temperatures.

Electromagnetic field simulation was performed using the simplified models to verify the effect of transmission characteristics. As illustrated in FIGS. 9A and 9B, a substrate provided with a microstrip line 42 having an impedance of about 50Ω was disposed on each of the metal stages 27 and 40 and was connected to the radio frequency signal interconnect 23A on the alumina multilayer wiring board 20 through wires 29.

Figure 10A:
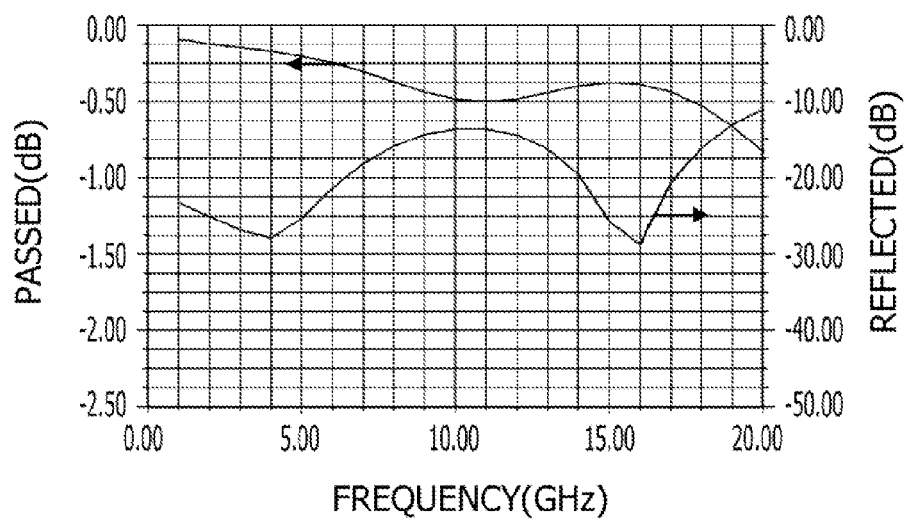
FIG. 10A is a graph illustrating the result of electromagnetic field simulation using the simplified model for verification of the effect of the transmission characteristics of the transceiving device according to the first embodiment.
Figure 10B:
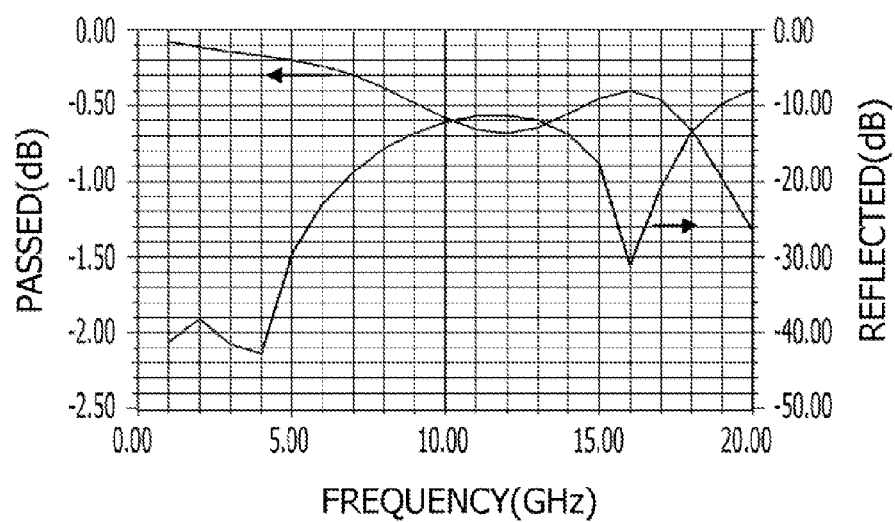
FIG. 10B is a graph illustrating the result of electromagnetic field simulation using the simplified model according to the comparative example of the first embodiment.

As a result, as compared with the structure illustrated in FIG. 9B, as the frequency was higher, the effect of transmission characteristics was considerably improved as illustrated in FIGS. 10A and 10B. For example, regarding transmission loss at 20 GHz, in the structure of FIG. 9B, it was about 1.3 dB as illustrated in FIG. 10B. In the structure of FIG. 9A, it was about 0.8 dB as illustrated in FIG. 10A, namely, it was improved. As described above, it was found that the use of the metal stage 27 having the structure illustrated in FIG. 9A and the electrical connection between the metal stage 27 and the radio frequency ground interconnect 23B of the multilayer wiring board 20 reduced the inductance of ground, impedance mismatch was reduced, and the high-frequency characteristics were improved.

An electronic apparatus, a method of making the same, and a transceiving device according to a second embodiment will be described with reference to FIGS. 11 and 12.

The electronic apparatus, the method of making the same, and the transceiving device according to the second embodiment differ from those in the above-described first embodiment (refer to FIG. 1) in the shapes of the metal stage opening 20A of the multilayer wiring board 20 and the metal stage 27.

Figure 11:
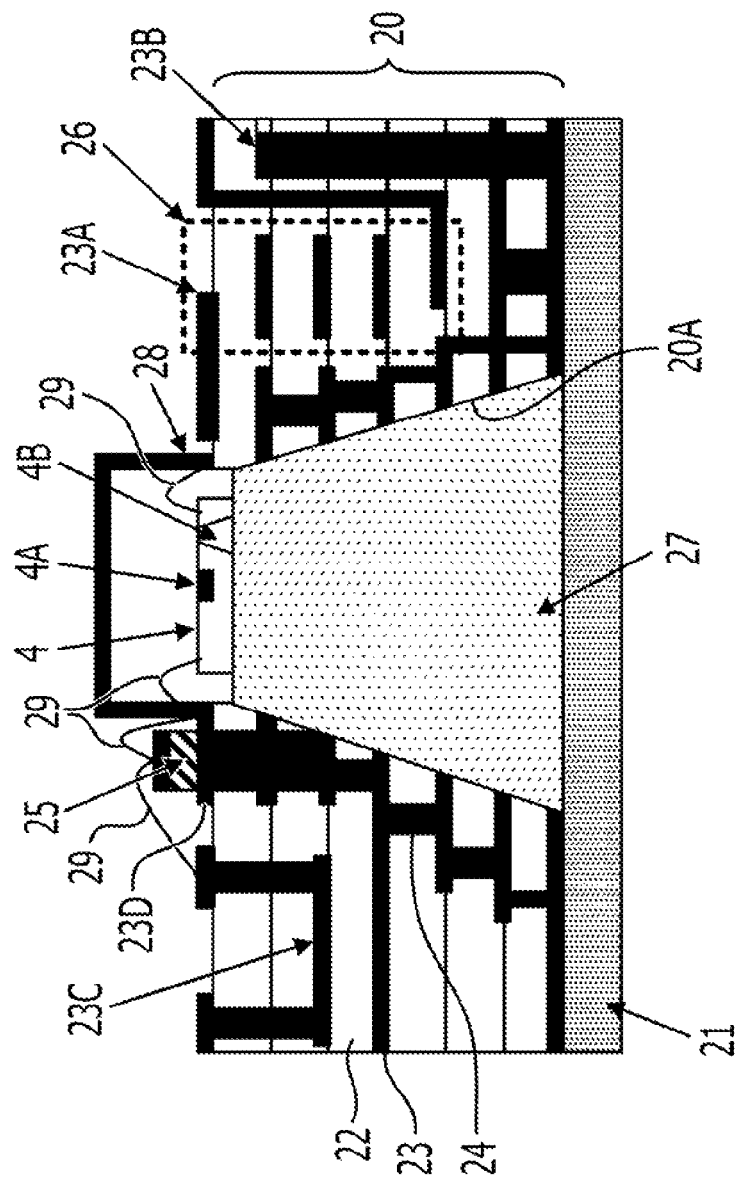
FIG. 11 is a schematic cross-sectional view of a transceiving device according to a second embodiment of the present invention.
Figure 12:
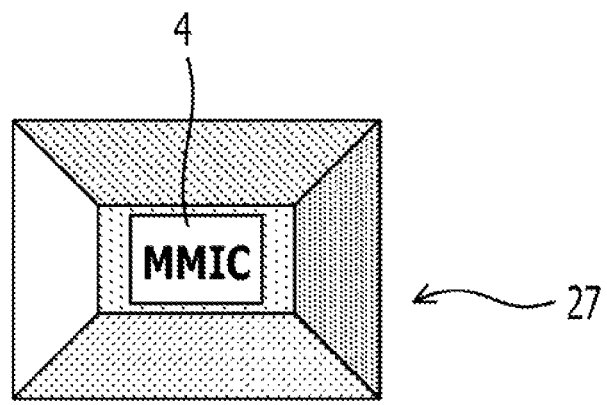
FIG. 12 is a schematic plan view of a metal stage included in the transceiving device according to the second embodiment.

Specifically, a metal stage 27 in the second embodiment is mesa-shaped such that the vertical cross-section is a trapezoid, namely, it becomes wider toward the bottom as illustrated in FIGS. 11 and 12. A multilayer wiring board 20 has a metal stage opening 20A having a shape corresponding to the shape of the metal stage 27. Specifically, the wall surfaces, defining the metal stage opening 20A, of the multilayer wiring board 20 are inclined flat surfaces shaped like edges. The metal stage 27 is fitted in the metal stage opening 20A of the multilayer wiring board 20.

Because other components of the apparatus and details of the method of making the apparatus are the same as those of the above-described first embodiment, description thereof is omitted. Note that when a plurality of alumina base substrates 22 having different-sized openings 22A are formed to provide the alumina multilayer wiring board 20, the wall surfaces of each alumina base substrate 22 defining the opening 22A are made as inclined flat surfaces shaped like edges. Furthermore, the openings 22A of the alumina base substrates 22 are formed such that while all of the alumina base substrates 22 are laminated, the inclined wall surfaces, defining the openings 22A, of the alumina base substrates 22 on each side are continuously arranged as a single inclined flat surface.

The electronic apparatus, the method of making the same, and the transceiving device according to the second embodiment therefore have advantages in that the thermal resistance of the metal stage 27 is reduced, the heat dissipation performance thereof is improved, and the temperature of the semiconductor device 4 is prevented from increasing similar to those of the above-described first embodiment.

The present invention is not limited to the structures described in the above-described first and second embodiments and various modifications and changes may be made without departing from the spirit and scope of the present invention.

For example, the metal stage 27 is shaped such that the vertical cross-section becomes wider toward the bottom in the radio frequency signal transmission direction (power output direction) and the direction orthogonal thereto in the above-described first and second embodiments. The present invention is not limited to the embodiments. For instance, the metal stage 27 may be shaped such that the vertical cross-section in the radio frequency signal transmission direction (signal transmission direction) becomes wider toward the bottom and that in the direction orthogonal to the signal transmission direction is a rectangle. Alternatively, the metal stage 27 may be shaped such that the vertical cross-section in the direction orthogonal to the radio frequency signal transmission direction becomes wider toward the bottom and that in the radio frequency signal transmission direction is a rectangle.

Furthermore, in the above-described first and second embodiments, the wall surfaces of the metal stage 27 are electrically connected to the radio frequency ground interconnect 23B and the power supply ground interconnect 23D of the multilayer wiring board 20 such that the metal stage 27 functions as an RF/power supply ground line. The present invention is not limited to the above embodiments. For example, the wall surfaces of the metal stage 27 may be electrically connected to the radio frequency ground interconnect 23B of the multilayer wiring board 20 and may be electrically disconnected from the power supply ground interconnect 23D such that the metal stage 27 functions as an RF ground line. In this case, the wall surface of the metal stage 27 to which a radio frequency signal is input and the wall surface thereof from which the radio frequency signal is output may be electrically connected to the radio frequency ground interconnect 23B. Consequently, at least the high-frequency characteristics (transmission characteristics) may be increased. For example, the wall surfaces of the metal stage 27 may be electrically connected to the power supply ground interconnect 23D of the multilayer wiring board 20 and may be electrically disconnected from the radio frequency ground interconnect 23B such that the metal stage 27 functions as a power supply ground line. Thus, at least the power supply ground may be stabilized.

Preferably, the metal stage 27 is shaped such that the vertical cross-section becomes wider toward the bottom in the radio frequency signal transmission direction (signal transmission direction), and the wall surface of the metal stage 27 to which a radio frequency signal is input and the wall surface thereof which the radio frequency signal is output from are electrically connected to the radio frequency ground interconnect 23B. Consequently, at least the high-frequency characteristics (transmission characteristics) may be increased. In this case, the length of the end surface of the metal stage 27 facing the metal base 21 in the signal transmission direction is longer than that of the metal stage 27 facing the semiconductor device 4 in the signal transmission direction.

In addition, in the above-described first and second embodiments, the metal stage 27 is shaped such that the area of the horizontal cross-section increases as the horizontal cross-section approaches the metal base 21. The present invention is not limited to the embodiments. Specifically, in the first embodiment, the area of the horizontal cross-section of the metal stage 27 increases in a stepwise manner as the horizontal cross-section approaches the metal base 21. In the second embodiment, the area of the horizontal cross-section of the metal stage 27 continuously increases as the horizontal cross-section approaches the metal base 21. The present invention is not limited to the embodiments. For example, so long as the end surface of the metal stage 27 facing the metal base 21 is larger than that of the metal stage 27 facing the semiconductor device 4, the metal stage 27 may be shaped such that a portion closer to the metal base 21 than the semiconductor device 4 has a smaller horizontal cross-sectional area. In this case, because the metal stage opening 20A of the multilayer wiring board 20 has a shape corresponding to the shape of the metal stage 27, the metal stage opening 20A may be shaped such that a portion closer to the metal base 21 than the semiconductor device 4 has a smaller horizontal cross-sectional area, so long as at least the size of the opening 20A adjacent to the metal base 21 is larger than that of the opening 20A adjacent to the semiconductor device 4.

Figure 13:
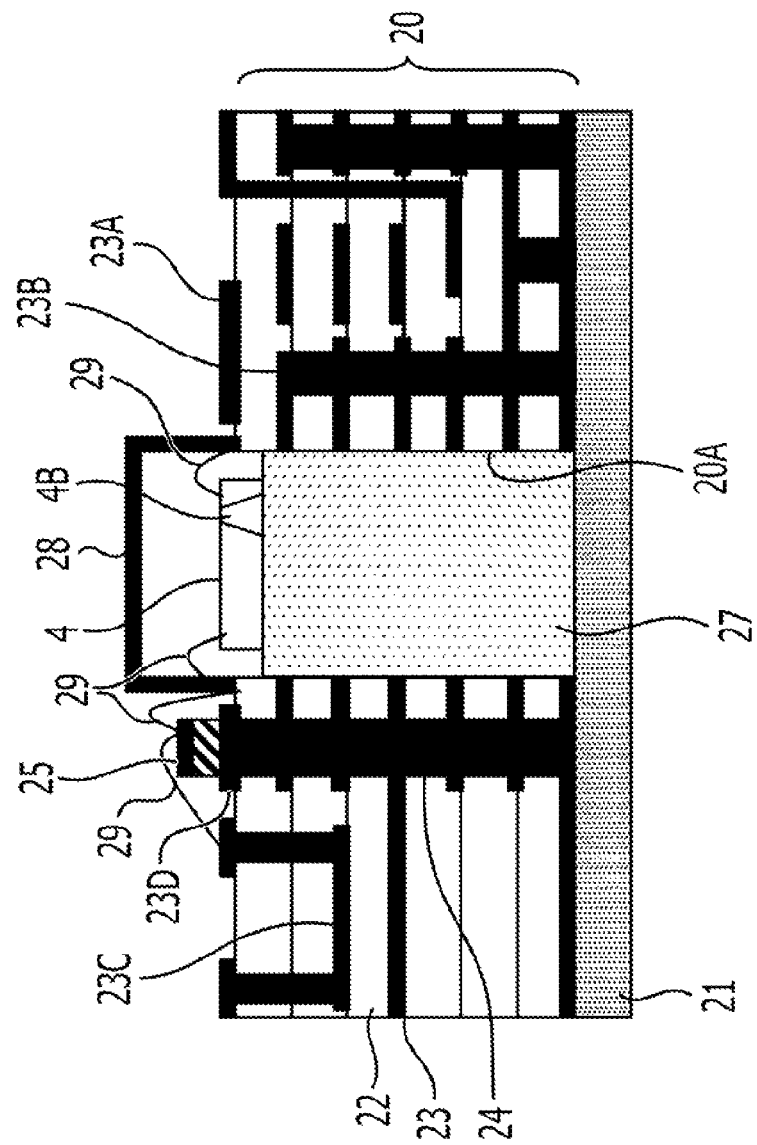
FIG. 13 is a schematic cross-sectional view of a transceiving device according to a modification of the embodiments.
Figure 14:
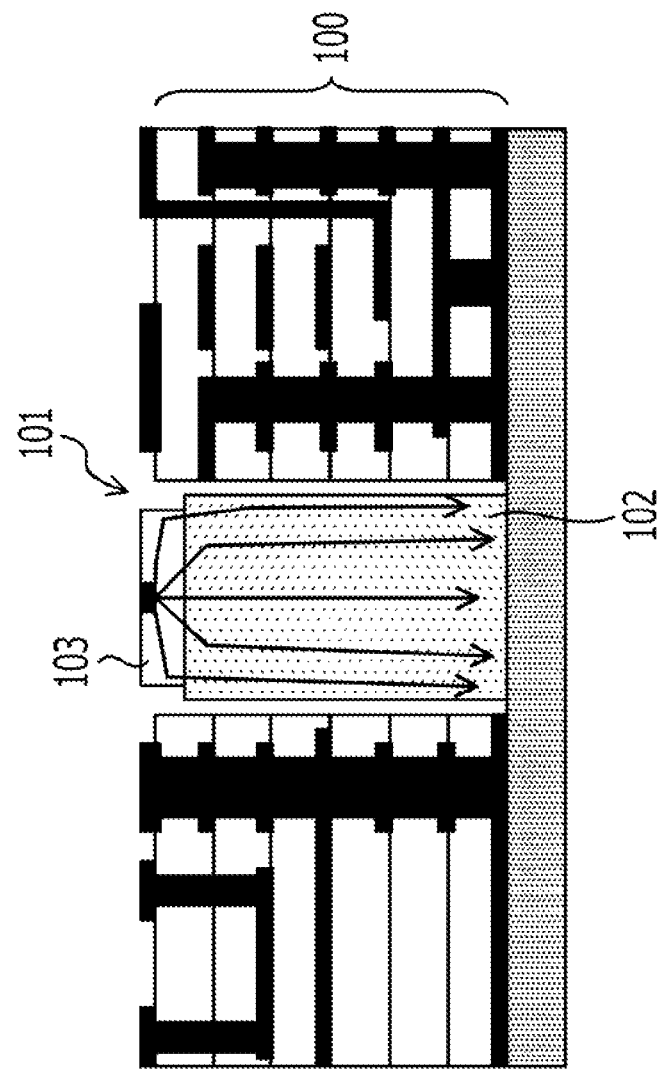
FIG. 14 is a schematic cross-sectional view of a related-art transceiving device.

Moreover, the metal stage 27 has the shape that becomes wider toward the bottom in the above-described first and second embodiments. The present invention is not limited to the embodiments. For example, as illustrated in FIG. 13, the metal stage 27 may be rectangular-parallelepiped-shaped. In this case, so long as the wall surfaces of the metal stage 27 are electrically connected to the radio frequency ground interconnect (ground interconnect) of the multilayer wiring board 20, the discontinuity between the metal stage 27 and the radio frequency ground interconnect 23B may be reduced, thus increasing the high-frequency characteristics (transmission characteristics). In addition, so long as the wall surfaces of the metal stage 27 are electrically connected to the power supply ground interconnect (ground interconnect) of the multilayer wiring board 20, the discontinuity between the metal stage 27 and the power supply ground interconnect 23D may be reduced, thus stabilizing the power supply ground. Furthermore, because the metal stage 27 functions as the RF/power supply ground line, the number of vias may be reduced, thus increasing the strength.

In the above-described first and second embodiments, the case where the present invention is applied to the electronic apparatus (transceiving device) including the high-power amplifier and the method of making the same has been described as an example. The present invention is not limited to the embodiments. The present invention is widely applicable to electronic apparatuses (transceiving devices) including a semiconductor device that generates heat and methods of making the same. For example, the present invention is applicable to an electronic apparatus (transceiving device) including an MMIC chip, such as an MMIC chip formed on a GaAs substrate or an MMIC chip including an amplifier or a switch in MMIC form, and a method of making the same.

In the above-described first and second embodiments, the metal stage opening 20A of the multilayer wiring board 20 has a shape corresponding to the shape of the metal stage 27. The present invention is not limited to the embodiments. For example, the multilayer wiring board 20 may include the metal stage opening 20A defined by wall surfaces orthogonal to the surface of the multilayer wiring board. The metal stage opening 20A may have a shape which does not correspond to the shape of the metal stage 27 as described above such that a gap is formed between the metal stage 27 and the multilayer wiring board 20. In this case, because the metal stage 27 has the shape that becomes wider toward the bottom, the advantages are obtained in that the thermal resistance of the metal stage 27 may be reduced, the heat dissipation performance thereof may be improved, and the temperature of the semiconductor device 4 may be prevented from increasing. In this case, the metal stage 27 is electrically connected to the radio frequency ground interconnect 23B through the metal base 21.

In the above-described first and second embodiments, all of the components which constitute the transmitting unit 1 and the receiving unit 2 of the transceiving device are mounted on the multilayer wiring board 20, thus constituting the electronic apparatus. The present invention is not limited to the embodiments. For example, components constituting at least one of the transmitting unit 1 and the receiving unit 2 of the transceiving device may be mounted on the multilayer wiring board 20 to constitute the electronic apparatus. Specifically, the transceiving device may be configured such that at least one of the transmitting unit 1 and the receiving unit 2 includes the metal base 21, the multilayer wiring board 20 which is disposed on the metal base 21 and has the metal stage opening 20A and includes the interconnects 23, the metal stage 27 which is disposed in the metal stage opening 20A and serves as a ground line, and the semiconductor device 4 disposed on the metal stage 27, and the end surface of the metal stage 27 facing the metal base 21 is larger than that of the metal stage 27 facing the semiconductor device 4.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present inventions have been described in detail, it should be understood that the various changes, substitutions, and alterations could be made hereto without departing from the spirit and scope of the invention.

What is claimed is:

1. An electronic apparatus, comprising:
   a metal base;
   a wiring board disposed on the metal base, the wiring board having an opening and including interconnects;
   a metal stage disposed in the opening, the metal stage serving as a ground line; and
   a semiconductor device disposed on the metal stage,
   wherein an area of an end surface of the metal stage facing the metal base is larger than that of the metal stage facing the semiconductor device,
   wherein the interconnects include a ground interconnect, and
   wherein wall surfaces of the metal stage are electrically connected to the ground interconnect.

2. The apparatus according to claim 1, wherein the metal stage has stepped wall surfaces.

3. The apparatus according to claim 1, further comprising: a metal cavity provided in the wiring board, the metal cavity covering the semiconductor device.

4. The apparatus according to claim 1, wherein the semiconductor device is a high-power amplifier comprising a wide band gap semiconductor material.

5. The apparatus according to claim 1, wherein the length in a signal transmission direction of the end surface of the metal stage facing the metal base is longer than that of the metal stage facing the semiconductor device.

6. The apparatus according to claim 1, wherein the metal stage is shaped such that the area of the horizontal cross-section increases as the horizontal cross-section approaches the metal base.

7. A transceiving device comprising:
   a transmitting unit configured to transmit a signal; and
   a receiving unit configured to receive a reflected signal of the transmitted signal,
   wherein at least one of the transmitting unit and the receiving unit includes:
   a metal base;
   a wiring board disposed on the metal base, the wiring board having an opening and including interconnects,
      a metal stage disposed in the opening, the metal stage serving as a ground line, and
      a semiconductor device disposed on the metal stage,
   wherein an area of an end surface of the metal stage facing the metal base is larger than that of the metal stage facing the semiconductor device,
   wherein the interconnects include a ground interconnect, and
   wherein wall surfaces of the metal stage are electrically connected to the ground interconnect.

8. The device according to claim 7, wherein the metal stage has stepped wall surfaces.

9. The device according to claim 7, further comprising: a metal cavity provided in the wiring board, the metal cavity covering the semiconductor device.

10. The device according to claim 7, wherein the semiconductor device is a high-power amplifier comprising a wide band gap semiconductor material.

11. The device according to claim 7, wherein the length in a signal transmission direction of the end surface of the metal stage facing the metal base is longer than that of the metal stage facing the semiconductor device.

12. The device according to claim 7, wherein the metal stage is shaped such that an area of the horizontal cross-section increases as the horizontal cross-section approaches the metal base.

13. A method of making an electronic apparatus, comprising the steps of:
   disposing a wiring board on a metal base, the wiring board having an opening and including interconnects;
   disposing a metal stage in the opening, the metal stage serving as a ground line; and
   disposing a semiconductor device on the metal stage,
   wherein the metal stage is shaped such that an area of an end surface of the metal stage facing the metal base is larger than that of the metal stage facing the semiconductor device,
   wherein the interconnects include a ground interconnect, and
   wherein the metal stage is disposed in the opening such that wall surfaces of the metal stage are electrically connected to the ground interconnect.

14. The method according to claim 13, further comprising: laminating a plurality of base substrates having different-sized openings and including interconnects such that the openings are aligned to form the wiring board.

15. The method according to claim 13, further comprising: disposing a metal cavity in the wiring board such that the metal cavity covers the semiconductor device.

16. The method according to claim 13, further comprising: disposing another semiconductor device on the wiring board.

17. The method according to claim 13, wherein the metal stage is shaped such that the area of the horizontal cross-section increases as the horizontal cross-section approaches the metal base.

* * * * *